United States Patent [19]
Fosnight et al.

[11] Patent Number: 5,988,233
[45] Date of Patent: Nov. 23, 1999

[54] EVACUATION-DRIVEN SMIF POD PURGE SYSTEM

[75] Inventors: William J. Fosnight, Austin, Tex.; Anthony C. Bonora, Menlo Park; Raymond S. Martin, San Jose, both of Calif.; Jay Tatro, Austin, Tex.

[73] Assignee: Asyst Technologies, Inc., Fremont, Calif.

[21] Appl. No.: 09/049,461

[22] Filed: Mar. 27, 1998

[51] Int. Cl.⁶ ........................................... B65B 1/04
[52] U.S. Cl. ................................. 141/63; 141/98; 414/217
[58] Field of Search .................................. 141/63, 65, 66, 141/98, 59; 414/217, 221, 292

[56] References Cited

U.S. PATENT DOCUMENTS

| | | | |
|---|---|---|---|
| 5,169,272 | 12/1992 | Bonora et al. | 414/217 |
| 5,378,283 | 1/1995 | Ushikawa | 414/217 |
| 5,806,574 | 9/1998 | Yamashita et al. | 141/63 |
| 5,810,062 | 9/1998 | Bonora et al. | 141/98 |

*Primary Examiner*—Steven O. Douglas
*Attorney, Agent, or Firm*—Fliesler, Dubb, Meyer & Lovejoy LLP

[57] ABSTRACT

A system for providing uniform, controlled and efficient purge gas flow rates and gas flow patterns for removing contaminants and/or particulates from wafers within a pod. The purge system includes seals at the interfaces between the gas inlet and removal lines to substantially prevent leakage at the interfaces. The system may establish seals at the inlet and outlet without having to use conventional fluid flow pins extending above the support surface. The negative pressure applied at the outlet controls the flow rate through the pod, and the rate at which gas leaves the pod will limit the rate at which gas may enter the pod. In a preferred embodiment, the inlet flow is approximately equal to the outlet flow. With substantially equal inlet and outlet pressures, the purging gas flows through the upper and lower portions of the pod in a substantially uniform flow pattern so that contaminants and particulates are removed evenly from wafers throughout the pod. As an alternative to the normal purge and/or trickle modes of operation, the system may remove a volume of gas from a pod and replace it with a new volume of gas by operating the low pressure source with the high pressure source turned off. Further still, the flow lines may include flow rate control systems that provide purging flow for a predetermined time interval, and thereafter provide a trickle flow as long as the pod is seated on the support surface.

20 Claims, 6 Drawing Sheets

EVACUATION-DRIVEN SMIF POD PURGE SYSTEM

CROSS REFERENCE TO RELATED APPLICATIONS

The present application is related to the following U.S. patent applications, which applications are owned by the assignee of the present invention and which applications are hereby incorporated by reference in their entirety:

U.S. patent application Ser. No. 09/049,330, entitled "Kinematic Coupling Compatible, Passive Interface Seal", filed Mar. 27, 1998, which application is currently pending; and U.S. patent application Ser. No. 09/049,354, entitled "Modular SMIF Pod Breather, Adsorbent, and Purge Cartridges", filed Mar. 27, 1998, which application is currently pending.

BACKGROUND OF THE INVENTION

Field of the Invention

The present invention relates to SMIF systems, and more particularly to systems for allowing gas to be controllably injected into and removed from SMIF pods.

Description of Related Art

A SMIF system proposed by the Hewlett-Packard Company is disclosed in U.S. Pat. Nos. 4,532,970 and 4,534,389. The purpose of a SMIF system is to reduce particle fluxes onto semiconductor wafers during storage and transport of the wafers through the semiconductor fabrication process. This purpose is accomplished, in part, by mechanically ensuring that during storage and transport, the gaseous media (such as air or nitrogen) surrounding the wafers is essentially stationary relative to the wafers, and by ensuring that particles from the ambient environment do not enter the immediate wafer environment.

A SMIF system has three main components: (1) minimum volume, sealed pods used for storing and transporting wafers and/or wafer cassettes; (2) an input/output (I/O) minienvironment located on a semiconductor processing tool to provide a miniature clean space (upon being filled with clean air) in which exposed wafers and/or wafer cassettes may be transferred to and from the interior of the processing tool; and (3) an interface for transferring the wafers and/or wafer cassettes between the SMIF pods and the SMIF minienvironment without exposure of the wafers or cassettes to particulates. Further details of one proposed SMIF system are described in the paper entitled "SMIF: A TECHNOLOGY FOR WAFER CASSETTE TRANSFER IN VLSI MANUFACTURING," by Mihir Parikh and Ulrich Kaempf, *Solid State Technology*, July 1984, pp. 111–115.

Systems of the above type are concerned with particle sizes which range from below 0.02 microns ($\mu$m) to above 200 $\mu$m. Particles with these sizes can be very damaging in semiconductor processing because of the small geometries employed in fabricating semiconductor devices. Typical advanced semiconductor processes today employ geometries which are one-half $\mu$m and under. Unwanted contamination particles which have geometries measuring greater than 0.1 $\mu$m substantially interfere with 1 $\mu$m geometry semiconductor devices. The trend, of course, is to have smaller and smaller semiconductor processing geometries which today in research and development labs approach 0.1 $\mu$m and below. In the future, geometries will become smaller and smaller and hence smaller and smaller contamination particles become of interest.

In practice, a SMIF pod is set down on various support surfaces within a wafer fab, such as for example at a load port to a minienvironment, whereupon interface mechanisms in the load port open the pod door to allow access to the wafers within the pod. Additionally, a pod may be supported at a storage location while awaiting processing at a particular tool. Such storage locations may comprise a local tool buffer in the case of metrology or high throughput tools, or may alternatively comprise a stocker for storing large numbers of pods within a tool bay. A pod may additionally be positioned at a stand-alone purge station.

Whether a tool load port, local tool buffer, stocker or purge station, the support surfaces typically include registration or kinematic pins protruding upward from the support surface. In 200 mm pods, the support surface includes registration pins and guide rails which guide the pod into the proper rotational and translational position with respect to the pins. In 300 mm pods, a bottom surface of the pods includes radially extending grooves for receiving kinematic pins. Once the pod is positioned so that the grooves engage their respective kinematic pins, the grooves settle over the pins to establish six points of contact between the pod and support platform (at the grooves and pins) to kinematically couple the pod to the support platform with fixed and repeatable accuracy. Such a kinematic coupling is for example disclosed in U.S. Pat. No. 5,683,118, entitled "Kinematic Coupling Fluid Couplings and Method", to Slocum, which patent is incorporated by reference herein in its entirety. The size and location of the kinematic pins are standardized so that the pods of various suppliers are compatible with each other. The industry standard for the location and dimensions of the kinematic coupling pins are set by Semiconductor Equipment and Materials International ("SEMI").

Occasionally, it is advantageous to purge a pod of contaminants and/or particulates by creating a current flow through a pod to carry away the contaminants and/or particulates. It may also be beneficial to fill a pod with a non-reactive gas for longer term storage and certain processes. Additionally, it may be advantageous on occasion to provide the pod with a pressure higher or lower than ambient. In order to accomplish such purging, it is known to provide one or more valves within a pod which allow fluid flow to and/or from the interior of the pod. Inlet valves to the pod may be connected to a pressurized gas source to fill the pod with a desired gas, and outlet valves may be connected to a vacuum source to capture gas escaping from the pod. The inlet and outlet valves may be used to purge the pod, including filling the pod with a desired gas, and/or providing a pressure differential within the pod relative to ambient. Such a system is disclosed in U.S. Pat. No. 4,724,874, entitled "Sealable Transportable Container Having a Particle Filtering System", to Parikh et al., which patent is assigned to the owner of the present application, and which patent is incorporated by reference herein in its entirety. Relative to systems which require opening of the pod for purging, valve systems require less components and space, and in general operate more efficiently.

Conventional purging systems may generally be considered "push" systems. Gas flow inlets in conventional systems are connected to a pressurized gas source, which pushes gas through the pod. Conventional systems have attempted to create a tight interface seal at the inlet to ensure that the pressurized inlet gas enters the pod as opposed to escaping around the seal into the fab. Conversely, gas flow outlets in conventional systems are connected to a low pressure source and typically include a loose seal, referred to as a proximity seal. Gas which is forced out of the pressurized pod through the outlet is drawn away by the low pressure source and does not escape to ambient.

Conventional thinking is that it is disadvantageous to attempt a tight seal at the outlet. Such a tight seal could result in greater gas flow being drawn out of the pod than is being supplied by the pressurized inlet source unless sophisticated pressure sensors and flow controls are employed. In the absence of such pressure sensors and flow controls, the ambient, contaminant rich air surrounding the pod would be drawn into the pod around the interface seal at the inlet. Thus, conventional outlet seals have merely captured gas that is forced out of the outlet valve. To the extent that the low pressure source attempts to pull a greater volume of gas than is escaping from the pod, the proximity seal allows ambient air to be drawn into the exit line around the proximity seal, thus ensuring that the negative pressure source does not create a negative pressure within the pod.

Such conventional purging systems have several drawbacks. First, the pods include various filters and/or valves at the inlet and outlet which resist the flow of gas into the pods. Thus, it is difficult to provide an effective inlet seal, and it is not uncommon for as much as 50% of the inlet gas to escape around the inlet seal into the fab in conventional purge systems. As conventional systems attempt to control the gas flow through the pod largely by the pressure of the inlet gas, where some unknown amount of the inlet gas escapes around the seal, it is difficult to control flow through the pod, and difficult to control the uniformity of the purge process from pod to pod. Moreover, the large quantity of gas escaping into the fab may be harmful to fab personnel.

Another drawback to conventional purge systems relates to the manner in which the inlet interface seal is established. In an attempt to prevent leakage around the interface seal, the seal is established in general as a result of the weight of the pod downward, and a force of interface seal and pressurized inlet gas upward. In this instance, the interface seal at the inlet has to be relatively rigid to exert the necessary counterforce upward against the weight of the pod. A problem with such conventional interfaces is that the downward force of the weight of the pod has to be precisely matched to the upward force of the rigid interface and pressurized gas in response to the weight of the pod. Where the upward force of the interface is not enough to match the downward force of the pod, the pod seats on the kinematic pins without establishing a tight seal at the interface. On the other hand, where the upward force of the interface is large relative to the downward force of the pod, the interface seal interferes with a clean seating of the pod on the kinematic pins. Moreover, the weight of the pod on the seal tends to wear down the rigidity of the seal over time. Further still, the flow rate of the incoming gas may vary, thus varying the upward force of the gas against the pod. These factors further complicate the problem of matching the upward and downward forces of the pod and interface seal.

Another problem with current purge systems relates to the angle at which a pod is loaded onto the support surface. It is a feature of 300 mm pods that the kinematic coupling may be easily established substantially regardless of the approach angle of the pod with respect to the support surface. Once the pod has settled onto the kinematic pins in a six-point contact, the pod is in a fixed, precise and repeatable position on the support surface. However, due in part to the flexibility of the approach angle, when a pod initially engages the support surface, the flat bottom of the pod or one of the sloped surfaces of the grooves may engage any of the pins before the six-point contact is established. Thus, after initial contact, the pod may be positioned at a wide variety of angles with respect to the support surface. It is from these wide variety of initial angles that the pod settles over the pins, and the valves settle over the inlet and outlet valves in the desired positions.

In conventional purge systems, the gas flow lines from the positive pressure source terminate at the support surface at hollow flow pins that protrude above the support surface, which pins are received in the inlet valves when the pod is seated on the kinematic pins. However, as explained above, the initial engagement angle of the pod with respect to the support surface may vary significantly, anywhere from approximately 0° to 90°, and conventional flow pins and/or interface seals may catch on the pod at lower engagement angles. This may interfere with the kinematic coupling, and cause wear to the seal over time.

In an attempt to solve the problem of pod loading, it is known to provide "active" gas flow pins within the support surface. Active pins are those which are initially retracted below the support surface to allow the pod to be loaded onto the support surface from any angle. Thereafter, the gas flow pins may be raised upward into engagement with the gas flow valves. Such active systems require additional components and controls to ensure that the components are raised and lowered in the proper fashion and at the proper time. Additionally, such active systems disadvantageously exert upward forces on the pod which may interfere with the kinematic coupling as described above.

In addition to the difficulty in controlling the flow rate through a pod due to unknown quantities of gas escaping around the inlet seal, a still further problem with conventional purging systems is the lack of control such systems provide over the flow pattern of the purge gas within the pod. It is desirable that gas flow around each of the wafers within a pod during a purge cycle to thereby evenly remove particulates and/or contaminants from each of the wafers. In conventional push purging systems, the injected gas tends to flow substantially up through a pod, across a top surface of the pod, and down the opposing wall where it exits the pod. Thus, particulates and/or contaminants in this system are purged more effectively from the upper wafers within the pod than the lower wafers. Conversely, if the flow was only pulled through the pod, the gas would travel from the inlet, substantially across a bottom of the pod, and then out through the outlet valve. Thus, particulates and/or contaminants would be purged more effectively from the lower wafers in the pod than the upper wafers. Prior art systems have not attempted to address purge flow patterns within a pod by controlling the ratio of the inlet flow pressure to the outlet flow pressure.

SUMMARY OF THE INVENTION

It is therefore an advantage of the present invention to provide an improved purging system for removing particulates and/or contaminants from wafers within a pod.

It is another advantage of the present invention to provide a uniform, controlled and efficient purging process that ensures even gas flow rates and gas flow patterns through a pod.

It is a further advantage to provide a purging process including tight interface seals to substantially prevent gas leakage at both the inlet and outlet.

It is a still further advantage of the present invention to provide a purging system which is compatible with kinematic couplings and allows a pod to be loaded onto or removed from a support surface from any angle substantially between the vertical and horizontal without interference.

It is another advantage of the present invention to provide a purging system that does not to rely on the weight of the pod and rigidity of the interface seal to establish a tight seal.

It is a further advantage of the present invention to provide a purging system utilizing a passive interface seal which does not require actuated or controlled components.

It is a still further advantage of the present invention to provide a simple, reliable, and robust interface seal for establishing a tight seal between a gas flow line and a flow valve.

These and other advantages are accomplished by the present invention which relates in general to a system for providing uniform, controlled and efficient purge gas flow rates and gas flow patterns for removing contaminants and/or particulates evenly from wafers within a pod. The system includes a pair of gas supply lines through the support surface for supplying gas from a pressurized gas source, and a pair of gas removal lines through the support surface for removing gas from the pod via a vacuum source. Seals are provided at the interfaces between the gas inlet and removal lines to substantially prevent leakage at the interfaces. Thin, flexible interface seals use the pressure of the inlet and outlet lines to form the seal, and do not rely on the weight of the pod or rigidity of the interface to establish the seal. Moreover, the purge system may establish a tight seal at the inlet and outlet without having to use conventional fluid flow pins extending above the support surface. The omission of the flow pins, as well as the general low profile of the interface seal, allows a pod to be loaded onto or removed from the support surface from angles ranging substantially between the horizontal and vertical without the pod catching on the flow pins or interface seal.

The negative pressure applied at the outlet controls the flow rate through the pod, and the rate at which gas leaves the pod will limit the rate at which gas may enter the pod. In a preferred embodiment, the inlet flow is approximately equal to the outlet flow. With substantially equal inlet and outlet pressures, the purging gas flows through the upper and lower portions of the pod in a substantially uniform flow pattern so that contaminants and particulates are removed evenly from wafers throughout the pod.

As an alternative mode of operation to equal inlet and outlet flows, a volume of fluid within the pod may be replaced by drawing gas out of the pod through the low pressure line while the inlet flow is shut off. The reduced pressure within the pod draws the inlet and outlet seals into tight engagement with the pod to substantially prevent leakage around the seals. At some point during the evacuation, the inlet pressure may be turned on to backfill the pod with a new volume of gas. This process may be repeated to remove all or substantially all of a volume of gas within the pod, and to backfill the pod with a new volume of gas.

In a still further mode of operation, a flow control system may be provided within the inlet and/or outlet flow lines to provide purging flow for a predetermined time interval, and to thereafter provide a trickle flow as long as the pod is seated on the support surface.

BRIEF DESCRIPTION OF THE DRAWINGS

The invention will now be described with reference to the drawings in which.

DETAILED DESCRIPTION

The invention will now be described with reference to FIGS. 1–6, which in general relate to a system for providing uniform, controlled and efficient purge gas flow rates and gas flow patterns for removing contaminants and/or particulates from wafers within a pod. It is understood that the purging system according to the present invention may be used with SMIF systems of various sizes, including those adapted to work with 200 mm and 300 mm pods. Moreover, the purge system according to the present invention complies with and allows compliance with all relevant SEMI standards.

Figure 1:
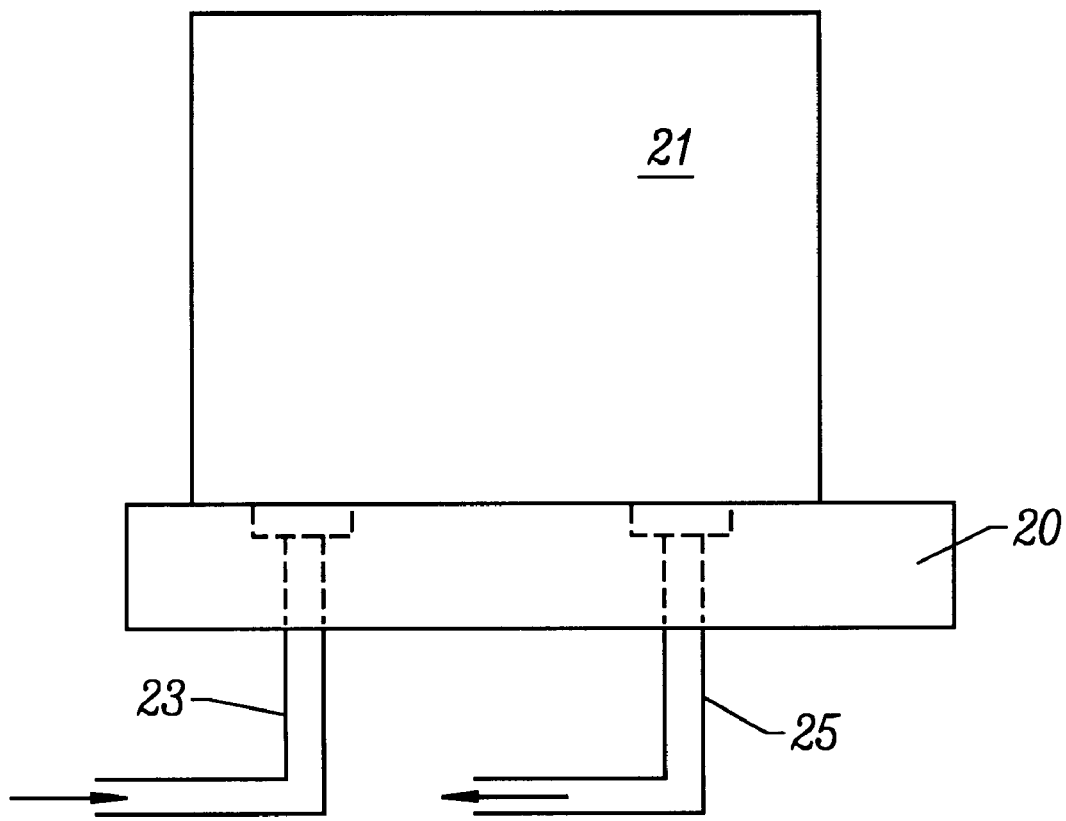
FIG. 1 is a schematic view of a pod on a support surface showing an inlet and outlet purge system according to the present invention.

Referring now to FIG. 1, there is shown a schematic side view of a support surface 20 with a SMIF pod 21 supported thereon. The support surface 20 may comprise any of various surfaces within a wafer fab provided for supporting a pod. Such surfaces include but are not limited to tool load ports, pod shelves within local tool buffers and stockers, and pod support platforms within standalone purge stations. A pair of gas supply lines 23 are connected through the support surface 20 for supplying gas from a pressurized gas source (not shown in FIG. 1) to pod 21. Similarly, a pair of gas removal lines 25 are connected through the support surface 20 for removing gas from the pod 21 via a vacuum source (not shown in FIG. 1).

Figure 2:
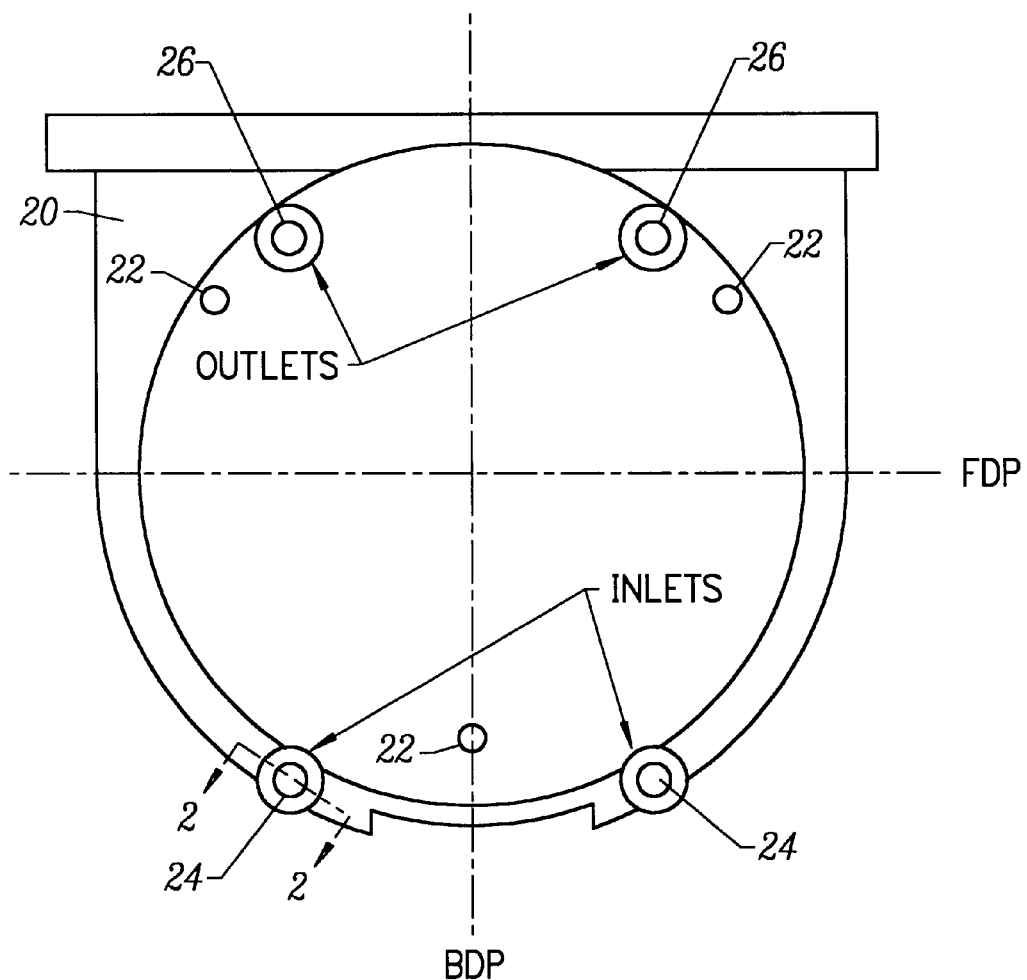
FIG. 2 is a top view of a support surface for supporting a pod, including inlets for allowing gas to be injected into the pod, and outlets for allowing gas to be evacuated from the pod.

Referring now to FIG. 2, support surface 20 includes a plurality of kinematic pins 22 for mounting within corresponding grooves on the bottom of a pod to establish a kinematic coupling between the pod and support surface. Pins 22 may alternatively comprise registration pins for receiving a 200 mm pod. The support surface 20 further includes a pair of inlet holes 24 provided down through the support surface and connecting to the gas supply lines 23, and a pair of outlet holes 26 provided down through the support surface and connecting to the pair of gas removal lines 25.

In a preferred embodiment, inlet holes 24 are located at a rear of the support platform, and outlet holes 26 are located at a front of the platform, so that when a pod is located on the support platform, inlet holes 24 will be located under a rear of the pod, and outlet holes 26 will be located under a front of the pod. With such a configuration, a purging flow through the pod may occur from a rear of the pod forward. This is advantageous in part because the pods are more narrow at their rear and the spreading of the injected gas naturally follows the contour of the pod as the gas flows toward the front of the pod. It is additionally advantageous to purge from the rear in cases where the pod door in a front opening pod is removed. Such a system promotes flow across the entire volume of the pod, and prevents particulates and/or contaminants from the adjacent process tool and/or minienvironment from entering the pod. Thus, the disclosed orientation of the inlet and outlet holes promotes even purge flow through the pod and minimizes purge times. It is understood that the number and position of inlet and outlet holes within the support surface 20 may vary in alternative embodiments of the invention. Moreover, it is understood that a single hole may function as both an inlet and an outlet for gas flow with respect to a pod located on the support surface. In such an embodiment, the inlet flow may alternate with the outlet flow.

As explained above, conventional push purging systems have several drawbacks. The purging system according to the present invention is a balanced flow purging system where gas is actively pulled from the gas outlet via the vacuum source. In particular, a tight seal is established at both the gas inlet and gas outlet holes by an interface seal 50 as described hereinafter. By providing tight seals at the inlet and outlet holes, and by controlling the ratio of the inlet-to-outlet pressure, the quantity of gas within the pod at a given time as well as the flow rate through the pod may be uniformly controlled. Uniform control of gas flow rate through the pod improves the efficiency and repeatability of contaminant and particulate removal from the wafers as well as reducing the time necessary for purging.

In a preferred embodiment, the inlet flow is approximately equal to the outlet flow, but the inlet flow may be higher, such as for example 10% higher, than the outlet flow in alternative embodiments. As explained in the Background of the Invention section, it is important that the flow rate out of the pod not exceed the flow rate into the pod. As such, the inlet flow may be slightly greater than the outlet flow. As would be appreciated by those of skill in the art, critical orifices may be employed in the gas inlet and gas outlet lines to precisely control the inlet and outlet flow rates. Precise control of the inlet and outlet flow rates further allows setting of the ratio of the inlet to outlet flows to approach one.

As explained in the Background of the Invention section, it is important to control both the gas flow rate through the pod, as well as the ratio of the inlet flow to the outlet flow. To the extent conventional purge systems have attempted to control these parameters, they have employed complicated monitoring and control devices, such as for example pressure sensors and mass flow controllers, at both the inlet and the outlet to the pod. These complicated devices were necessary at the inlet in pail because leakage at the inlet seal prevented any accurate predictability from the gas pressure within the inlet gas line alone of how much of the inlet gas was actually entering the pods. Moreover, the negative pressure being pulled from the pod had to be monitored and controlled to ensure that the draw at the outlet was at least slightly less than whatever amount of gas was measured to flow into the pod.

Conversely, it is a feature of the present invention that the flow rate through the pod, as well as the ratio of the inlet to outlet flows, may be easily controlled. In particular, because there is a tight seal at the outlet to the pod, the flow of gas being pulled from the pod may be accurately predicted by the flow within the outlet gas line alone. As the draw from the pod is known, the inlet flow may be set at a predetermined level which, as previously explained, may be slightly greater than or equal to the flow rate from the pod. Therefore, unlike conventional systems, only the flow in the outlet gas line need be controlled. As is known in the art, simple devices such as for example critical orifices may be connected to the outlet flow fine to precisely control the flow of gas through that line.

Moreover, as explained in the Background of the Invention section, where the system is predominantly a push system, gas tends to flow through the upper wafers in the pod, whereas in a system which is predominantly a pull system, gas tends to flow through the lower wafers in a pod. According to the present invention, the inlet and outlet pressures may be controlled to provide the optimal flow pattern through the pod so that gas flows through the upper and lower portions of the pod in a substantially uniform flow pattern, and contaminants and/or particulates are removed evenly from wafers throughout the pod. In order to provide a substantially even flow rate through the pod, the differential between the inlet and outlet pressures preferably is maintained at a substantially constant level. Furthermore, it is preferable to maintain the inlet pressure above ambient to prevent ambient air from entering the system, and to maintain the outlet pressure below ambient to promote a good outlet seal. The pressures at the inlets and outlets to the pod may be raised or lowered, together, to provide the optimal flow pattern, while at the same time maintaining a constant inlet and outlet pressure differential, as well as an inlet pressure above ambient and an outlet pressure below ambient. These optimal inlet and outlet pressures may be determined by air flow visualization techniques and/or computational fluid dynamic models.

According to one embodiment of the present invention, for a purge cycle, gas may be supplied to each inlet line at approximately 30 liters per minute (lpm) and drawn away at each outlet line at approximately 30 lpm. For low, or trickle, gas flow through a pod, each inlet line may provide gas at approximately 0.1 to 0.5 lpm and each outlet line may draw gas away at approximately 0.1 to 0.5 lpm. It is however understood that these flow rates for both the purge and trickle processes may vary in alternative embodiments.

It is a feature of the present invention that the flow rate through the outlet controls the flow rate through the pod, and the rate at which gas leaves the pod will limit the rate at which gas may enter the pod. As explained above, the flow of the gas supplied to the pod may slightly exceed the flow at which the gas is drawn away from the pod. To the extent that excess inlet gas is prevented from entering the pod as a result of the lower outlet flow rate, some inlet gas will be vented to the ambient through the inlet seal. However, unlike conventional systems, because the seal at the outlet is tight, and because the volume of gas at the inlet is controlled to be only slightly greater than or substantially equal to the volume of gas at the outlet, the amount of gas which is vented at the inlet will be small. For example, where the inlet gas is provided at a 10% higher pressure than at the outlet, no more than 10% of the gas will be vented to ambient at the inlet. Leakage of gas at these percentages is not harmful to fab personnel. Moreover, as the flow of gas through the pod is controlled by the gas flow rate at the outlet, the escape of gas from the inlet will not affect the control and uniformity of the volume of gas within the pod or the flow rate through the pod.

The interface seal 50 in the inlet and outlet holes 24 and 26 will now be described with reference to FIGS. 3A–4B. Pod 21 includes a bottom surface defining a well 40 in which a valve 42 may be mounted. Valve 42 may comprise a check valve which allows fluid flow in one direction. Thus, where a valve 42 is located over an inlet hole 24, the check valve 42 allows gas flow into the pod 21. Conversely, where a valve 42 is located over an outlet hole 26, the valve allows gas flow out of the pod 21. It is understood that the type of valve employed at the inlet and/or outlet is not critical to the present invention, and may vary in alternative embodiments of the invention. Different types of valves for use with the present invention are described in greater detail in U.S. patent application Ser. No. 09/049,330, previously incorporated by reference. The inlet and outlet holes may additionally include a filter 44 of known construction for filtering the gas flowing into and out of the pod 21. Such filters may for example be comprised of submicron particle filtering teflon membrane filter media. The filter 44 may be used with or without a valve 42. Although not critical, the valves and/or filters used in accordance with the present invention may be modular so that a valve and/or filter may be removed from well 40 and replaced by a different type of valve and/or filter as desired. Such a system is described in greater detail in U.S. patent application Ser. No. 09/049,354, previously incorporated by reference.

Figure 3A:
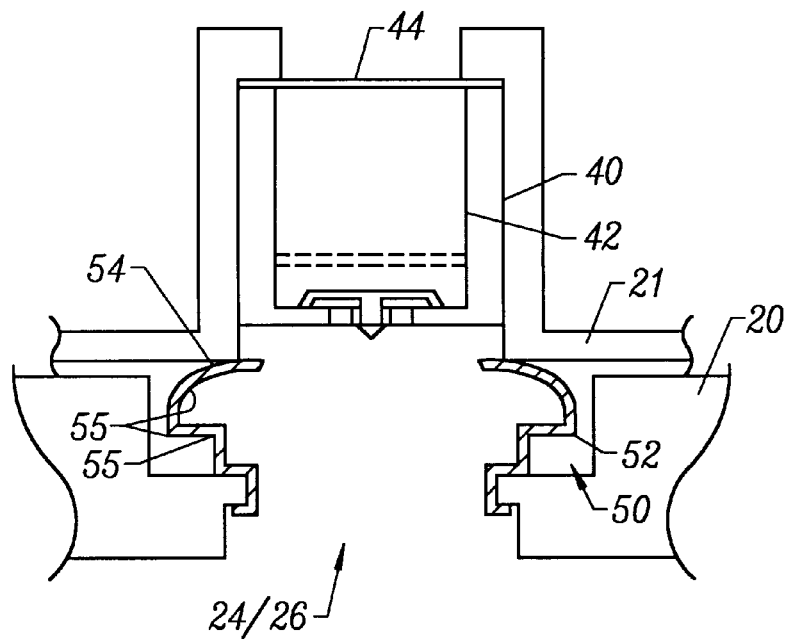
FIGS. 3A and 3B are side views of a pod on a support surface including an interface seal for use with the purge system according to the present invention.
Figure 3B:
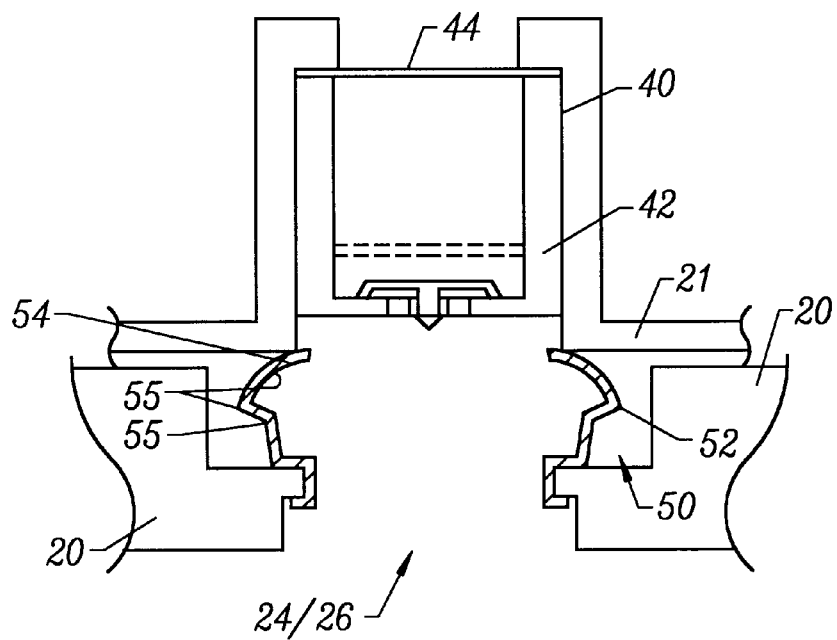

The interface seal 50 shown in FIGS. 3A and 3B comprises a grommet 52 which may preferably be mounted in each of the inlet and outlet holes 24 and 26 on the support surface. The grommet is preferably annular in shape, with a hollow center through which the gas may flow, and is preferably formed of an elastomeric material such as for example Viton ™ or various other low durometer fluoroelastomers. Grommet 52 has a cross-sectional shape (viewed from above) to match the shape of well 40. As set forth in the Background of the Invention section, conventional interface seals relied on the weight of the pod and a rigidity of the interface to establish a tight seal. It is a feature of the present invention that the weight of the pod and rigidity of the seal are not relied upon to establish the seal. In particular, grommet 52 includes an upper portion defining a dome 54 with a hole in its center. In its relaxed state, the dome 54 is slightly above or even with the top surface of support surface 20. The pod, once fully seated on the kinematic pins, preferably lies in light engagement with the upper surface of the dome 54. Grommet 52 is preferably thin, on the order of approximately 20 to 40 mils thick, and includes a plurality of bends 55. The thickness of the grommet together with the bends 55 make grommet 52 flexible so that the grommet 52 does not interfere with the kinematic coupling even where the pod engages the grommet upon seating on the kinematic pins. Moreover, as the interface seal does not support the weight of the pod, the interface seal according to the present invention will have less wear over time in comparison to conventional interface seals.

The shape of dome 54, together with the fact that the grommet extends only a slight distance above surface 20, allows a pod to be lowered onto the support surface from any angle substantially between the vertical and horizontal without the pod catching on the grommet 52. In the event the pod engages the grommet 52 while it is being loaded onto the support surface, the bends 55 allow the grommet to move flexibly in the lateral direction. The lateral flexibility of grommet 52 upon such engagement allows grommet 52 to form a tight seal (as explained hereinafter) even where the pod seats on the grommet with the grommet slightly off-center. Additionally, the lateral and vertical flexibility of the grommet reduces wear to the interface, which wear would otherwise occur as a result of engagement of a pod bottom with a rigid gasket upon approach of the pod onto the support surface.

As shown in FIG. 3B, once the pod is properly loaded onto the support surface 20, as indicated by a pod-in-place sensor or the like, the flow of gas through the inlet lines 23 and the suction through outlet lines 25 is initiated. At the inlet, as gas is injected from the supply lines, pressure within an interior of the grommet will increase such that the grommet will expand. Expansion of the grommet will flatten bends 55 and move the dome 54 upward and outward into sealing engagement with the pod. Moreover, the pulling of the gas through the pod according to the present invention further facilitates and maintains the seal. Thus, the interface seal according to the present invention is passively activated entirely by the flow of gas from the supply lines 23 to the removal lines 25. It is a further feature of the grommet that for higher purge flow rates, the grommet will expand to a greater extent, thereby establishing an even tighter seal. However, even upon high flow rates and large grommet expansion, the interface 50 will not interfere with the kinematic coupling.

Upon an increase in pressure and expansion of grommet 52, the inlet flow and bends 55 accomplish two functions. First, it is on occasion necessary to adjust the height of the kinematic pins 22 to adjust the position of a pod on the support surface. When the height of one or more of the kinematic pins 22 is adjusted, this may change the height of the sidewalls of well 40 over the support surface, and a slight space may exist between the grommet in a relaxed state and the pod when properly seated on the pins. However, any space that may exist is small, and the flow of gas through such a space will be smaller than the flow of gas through the inlet hole 24. Thus, upon introduction of the inlet pressure, the grommet will expand and rise upward as described above to form the seal. The amount that the grommet rises upward will vary depending on the spacing between the pod bottom and support surface. Thus, interface 50 is capable of self-adjusting its height to engage the pod and seal off the valve.

In addition to moving vertically upward to adjust to the height of the pod over the support surface, a second function accomplished by the inlet gas and bends 55 is that the dome 54 expands radially outward to thereby exert a horizontal force on the sidewalls of the well, thereby further improving the seal.

The grommet 52 in the outlet hole 26 is structurally and operationally similar to the grommet 52 described above with respect to the inlet. However, the grommet is drawn into engagement with the pod under different conditions than those which exist at the inlet. The shape of the grommet 52 together with the evacuation pressure create an area of localized low pressure immediately above the grommet 52. This localized low pressure pulls the grommet into sealing engagement with the pod 21. As above, the outlet grommet 52 is near to flush with the top of the support surface 20 and does not interfere with low angle loading or removal of the pod to or from the support surface. Additionally, the grommet is vertically flexible so that it may extend upward different degrees (depending on the pod-support surface spacing) to establish a tight seal, and is also laterally flexible to easily adjust to an off-center seal.

Figure 4A:
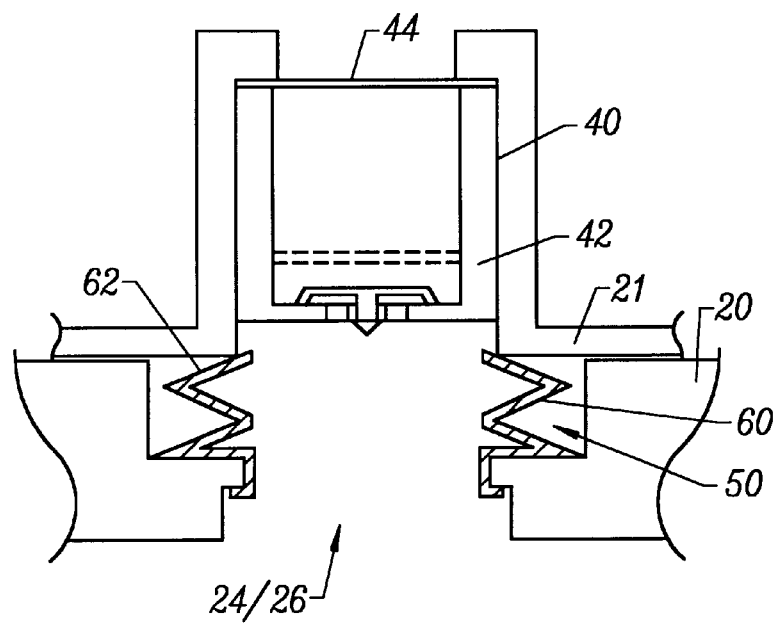
FIGS. 4A and 4B are side views of a pod on a support surface including an interface seal for use with the present invention according to an alternative embodiment.
Figure 4B:
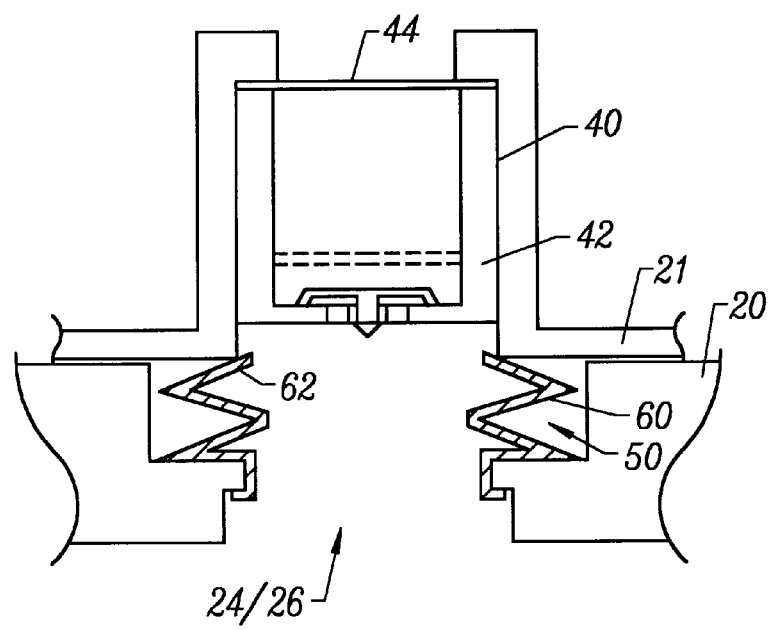

An interface seal 50 according to an alternative embodiment is shown in FIGS. 4A and 4B. Interface 50 comprises an annular bellows 60 mounted within the inlet and outlet holes 24 and 26. The bellows 60 is preferably formed of an elastomer, such as for example Viton™ or various other low durometer fluoroelastomers, and includes an opening through the center through which the gas may flow.

While bellows 60 has a slightly different configuration than grommet 52, bellows 60 in the inlet and outlet holes functions in a similar fashion to grommet 52 in the inlet and outlet holes. In particular, in its relaxed state, a top portion 62 of bellows 60 lies slightly above or even with the top surface of support surface 20 so as not to interfere with low angle loading or removal of the pod. Moreover, the bellows 60 is vertically flexible so that it may extend upward different degrees (depending on the pod-support surface spacing) until the top portion 62 establishes a seal at the inlet and outlet holes. The bellows 60 is also laterally flexible to easily adjust to an off-center seal. It is understood that other types of interface seals may be employed in the present invention provided that they are capable of providing a seal at both the inlet and outlet holes. Examples of such additional interface seals are disclosed in U.S. patent application Ser. No. 09/049,330, previously incorporated by reference.

It is a feature of the purge system according to the present invention that the interface 50 is compatible with kinematic couplings. In particular, the purge system may establish a seal at the inlet and outlet without having to use conventional fluid flow pins extending above the support surface. The omission of the flow pins, as well as the general low profile of the interface seal 50, allows a pod 21 to be loaded onto or removed from the support surface 20 from angles ranging between the horizontal and vertical without the pod catching on the flow pins or interface seal. Moreover, the present system does not employ any active interface systems with actuated parts. Such passive interfaces are in general more simple and inexpensive to manufacture, and less likely to malfunction over time.

In addition to the purge and trickle flow processes described above, the present invention may be used advantageously for rapid evacuation and replacement of a given volume of gas within a pod. To initiate such a process, the supply of gas through flow lines 23 is shut off while at the same time gas is evacuated from the pod via the outlet holes and the vacuum source. As the pressure within the pod decreases, the interface seals at each of the inlet and outlet holes will be drawn into tighter sealing engagement with the pod. At some point during the evacuation, for example where the pressure within the pod is 50% of ambient, the inlet supply of gas can be turned on to provide a supply of new gas to the pod. In view of the low pressure within the pod, and the tight seals at each of the interfaces, the pod will quickly backfill with the new gas. While the pod is backfilling with the new gas, the vacuum source may be shut off, or it may continue to run to draw gas out of the pod. This process may be repeated as desired to remove all or substantially all of a volume of gas within the pod, and to backffil the pod with a new volume of gas. Even where the interface seal 50 at each of the inlet and outlet holes is pulled tightly into engagement with the pod, this engagement will not alter the weight of the pod down on the kinematic pins, and will not interfere with the kinematic coupling of the pod on the support surface.

Figure 5:
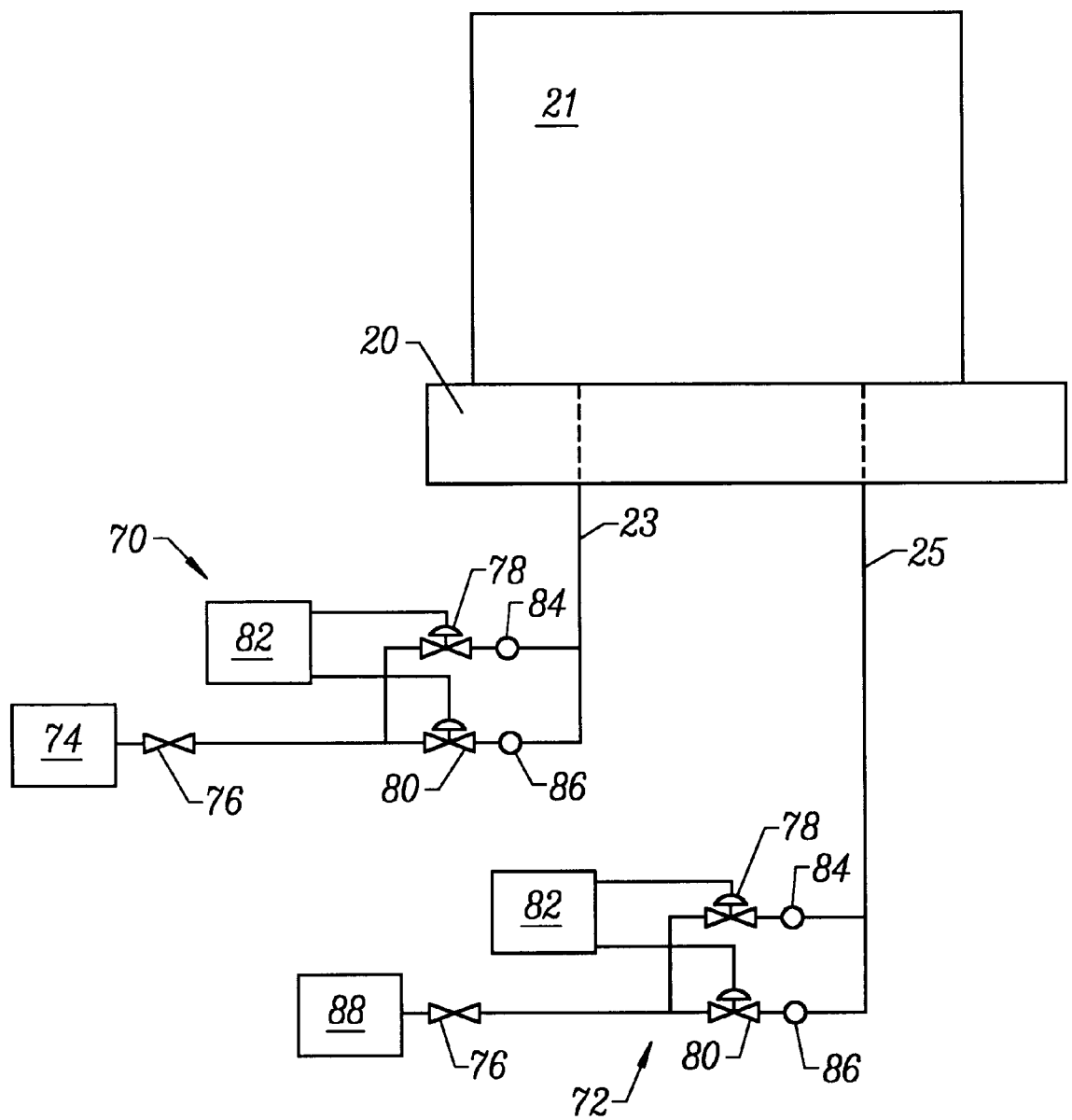
FIG. 5 is a schematic representation of a two stage flow system according to embodiments of the present invention.

An alternative embodiment of the system for operating the gas flow system according to the present invention will now be described with reference to FIGS. 5 and 6. FIG. 5 shows a schematic representation of a pod 21 seated on a support surface 20 including a gas supply line 23 and a gas removal line 25 as described above. Gas supply line 23 receives gas flow via a flow rate control system 70. Similarly, gas is withdrawn from the pod through gas removal line 25 via a flow rate control system 72. Preferably, the control systems 70 and 72 work in tandem so that when the flow rate control system 70 is supplying gas to the pod 21 at a particular rate, flow rate control system 72 is removing the gas at substantially the same rate. As discussed above, system 70 may provide gas to the pod 21 at a slightly higher rate than the system 72 removes it.

The control systems 70 and 72 are identical to each other with the exception that control system 70 supplies a flow of gas to the pod 21 while control system 72 removes a supply of gas from the pod 21. For convenience, a single such system is described hereinafter, with the understanding that like reference numerals between the systems 70 and 72 represent structurally and operationally identical components. Gas flow rate control system 70 includes the pressurized gas supply 74, including a valve 76 for turning on and shutting off the supply of gas at the source. The gas supply 74 may be a house source of pressurized gas, such as for example nitrogen. Alternatively, the gas supply 74 may be a localized supply of pressurized gas, such as for example a compressor fit with various filtering systems, for supplying a pressurized source of ultra-clean air. Where the gas supply 74 comprises a compressor and filtering system, the gas supply may be easily transported as needed.

The flow rate control system 70 further includes a pair of solenoid valves 78 and 80 connected to a voltage supply 82, and a pair of critical orifices 84 and 86 provided in the flow lines of valves 78 and 80, respectively. As is known in the art, critical orifices 84 and 86 are capable of outputting a fixed and accurate flow rate for various input flow rates above a threshold level. In a preferred embodiment, critical orifice 84 is capable of outputting a fixed and constant flow rate of 30 lpm, and critical orifice 86 is capable of outputting a fixed and constant flow rate of 0.1 lpm. It is understood that these respective flow rates are merely exemplary, and the flow rates may be greater or less than these in alternative embodiments of the invention.

Figure 6:
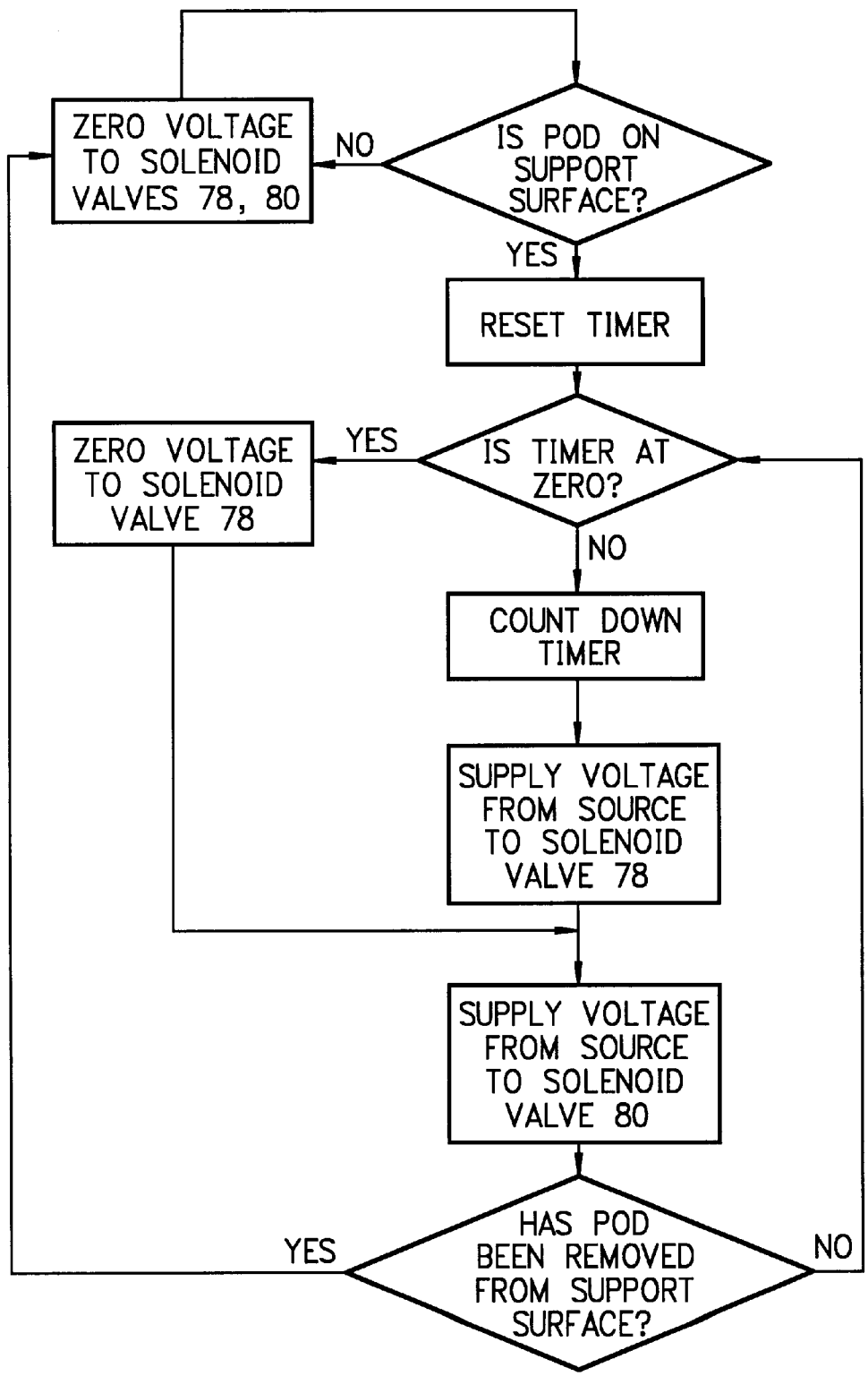
FIG. 6 is a flow chart illustrating the operation of a two stage gas flow system shown in FIG. 5.

Referring now to FIG. 5 and the flow chart of FIG. 6, voltage source 82 may be coupled through a controller to a pod-in-place sensor (not shown) indicating when a pod 21 is positioned on support surface 20. It is understood that various other sensors may be used instead of a pod-in-place sensor to indicate the presence of a pod 21 on any of various support surfaces 20.

Upon an initial indication of a pod 21 on support surface 20 via the sensor, a timer (not shown) is reset to a predetermined time interval and decremented. It is understood that the predetermined time interval may be adjustable. As long as the timer has not reached zero, the voltage source 82 supplies a voltage to both solenoid valves 78 and 80 to allow the flow of gas therethrough. Upon actuation, the valves 78 and 80 allow gas to flow through the critical orifices 84 and 86 so that gas supply line 23 receives the combined output from the critical orifices 84 and 86. In an embodiment where critical orifice 84 allows 30 lpm and the critical orifice 86 allows 0.1 1pm, a flow rate of 30.1 lpm will be supplied through line 23 to pod 21. As long as a pod remains on a support surface, and the time interval has not yet expired, voltage supply 82 will continue supplying a voltage to solenoid valve 78 to allow the high volume flow through critical orifice 84.

Once the time interval has expired, the controller sends a signal to the voltage source 82 to shut off the voltage to the solenoid valve 78. At this point, high volume supply of the flow to the pod is shut off. Voltage to the solenoid valve 80 is unaffected by expiration of the time interval, and flow to the pod 21 through the low flow rate critical orifice 86 continues unabated. If at any time, the pod is removed from the support surface 20, the voltage to solenoid valves 78 and 80 goes to zero and all flow of gas through the line 23 is shut off.

The system shown in FIG. 5 allows a controlled dual flow rate mode operation for gas flow through the pod, whereby the pod may initially be purged at a high flow rate for a preset time interval, and thereafter may have only a trickle flow as long as the pod is seated on the support surface.

As indicated above, flow removal control system 72 operates identically to system 70, with the exception that a vacuum source 88 pulls fluid through solenoid valve 78 and critical orifice 84, and/or solenoid valve 80 and critical orifice 86, depending on the supply of voltage to the respective solenoid valves. As will be appreciated by those of skill in the art, the system for controlling flow in FIG. 5 may be modified such that only gas removal line 25 includes a control circuit as described above. In such an embodiment, fluid may be supplied to the pod at a constant or adjustable flow rate with the provision that the flow of gas to the pod preferably equals or exceeds the flow of gas from the pod. Likewise, it is understood that the inlet line may include a control system as described above for providing a controlled variable flow to the pod 21, and that the outlet line have only a fixed or adjustable low pressure source, again with the provision that the inlet flow meet or exceed the outlet flow.

As will be further understood by those of skill in the art, each individual control system 70/72 may include only one solenoid and critical orifice for simply turning on and turning off a given flow to/from the pod 21. Further still, a control circuit 70/72 may alternatively include more than two solenoid valves and critical orifices. In such an embodiment, one valve and orifice pair may be dedicated to providing a trickle flow any time the pod 21 is on the support surface 20. The remaining valve and orifice pairs may be configured to allow fluid flow at various rates and for various time intervals. In a still further alternative embodiment to that shown in FIG. 5, each of the solenoid valves and/or critical orifices may be replaced by a single mass flow controller having, for example, two set points corresponding to a high purge flow rate and a low trickle flow rate, respectively. In this embodiment, the mass flow controller may include an associated controller for controlling the time interval during which the mass flow controller allows high flow and low flow.

Although the invention has been described in detail herein, it should be understood that the invention is not limited to the embodiments herein disclosed. Various changes, substitutions and modifications may be made thereto by those skilled in the art without departing from the spirit or scope of the invention as described and defined by the appended claims.

We claim:

1. A purge system for providing a controlled and uniform flow of gas through a pod, comprising:

an inlet to the pod capable of receiving a pressurized gas;

an outlet from the pod capable of allowing gas to be drawn from the pod;

a low pressure source for generating a negative pressure; and an outlet seal for firmly engaging the pod at said outlet to substantially prevent a flow of gas from outside the pod from being drawn to the low pressure source.

2. A purge system for providing a controlled and uniform flow of gas through a pod as recited in claim 1, further comprising a second interface seal at said inlet for substantially preventing the pressurized gas from flowing outside of the pod around said second interface.

3. A purge system for providing a controlled and uniform flow of gas through a pod as recited in claim 1, wherein a pressure of the pressurized gas entering the inlet and a pressure at which the low pressure source draws gas away from the pod are substantially equal.

4. A system associated with a load port for receiving a pod, the system providing a controlled flow of gas through an interior of the pod, comprising:

an inlet line having an end affixed within a first opening through a surface of the load port, said inlet line capable of supplying a pressurized gas to the pod;

an outlet line having an end affixed within a second opening through the surface of the load port, said outlet line capable of drawing gas out of the pod;

an inlet seal affixed within said first opening, said inlet seal being capable of transferring gas from said inlet line into the interior of the pod at a first substantially known flow rate; and an outlet seal affixed within said second opening, said outlet seal being capable of transferring gas from the interior of the pod to said outlet line at a second substantially known flow rate.

5. A system associated with a load port as recited in claim 4, wherein said first substantially known flow rate is substantially equal to said second substantially known flow rate.

6. A system associated with a load port as recited in claim 4, wherein said first substantially known flow rate is as much as approximately ten-percent (10%) higher than said second substantially known flow rate.

7. A system associated with a load port as recited in claim 4, wherein said first substantially known flow rate is substantially equal to 30 liters per minute.

8. A system associated with a load port as recited in claim 4, wherein said second substantially known flow rate is substantially equal to 30 liters per minute.

9. A system associated with a load port as recited in claim 4, wherein said first substantially known flow rate is substantially equal to between 0.1 to 0.5 liters per minute.

10. A system associated with a load port as recited in claim 4, wherein said second substantially known flow rate is substantially equal to between 0.1 to 0.5 liters per minute.

11. A system associated with a load port as recited in claim 4, wherein said inlet seal lies in firm engagement with a bottom of the pod at a valve for admitting gas during said transfer of gas from said inlet line.

12. A system associated with a load port as recited in claim 4, wherein said outlet seal lies in firm engagement with a bottom of the pod at a valve for allowing gas to escape the pod during said transfer of gas to said outlet line.

13. A system associated with a load port as recited in claim 4, wherein said first and second substantially known flow rates may be varied.

14. A system associated with a load port as recited in claim 4, wherein said first and second substantially known flow rates decrease after passage of a predetermined period of time measured from when the pod is initially seated on the load port.

15. A system associated with a load port for receiving a pod, the system providing a controlled flow of gas through an interior of the pod, comprising:

an inlet line having an end affixed within a first opening through a surface of the load port, said inlet line capable of supplying a pressurized gas to the pod;

an outlet line having an end affixed within a second opening through the surface of the load port, said outlet line capable of drawing gas out of the pod;

an inlet seal affixed within said first opening and protruding above the surface of the load port, said inlet seal being capable of transferring gas from said inlet line into the interior of the pod at a first substantially known flow rate, and said inlet seal being capable of engaging a bottom of the pod during said transfer of gas from said inlet line; and an outlet seal affixed within said second opening and protruding above the surface of the load port, said outlet seal being capable of transferring gas from the interior of the pod to said outlet line at a second substantially known flow rate, and said outlet seal being capable of engaging a bottom of the pod during said transfer of gas to said outlet line.

16. A system associated with a load port as recited in claim 15, wherein said first substantially known flow rate is substantially equal to said second substantially known flow rate.

17. A system associated with a load port as recited in claim 15, wherein said first substantially known flow rate is as much as approximately ten-percent (10%) higher than said second substantially known flow rate.

18. A system associated with a load port as recited in claim 15, wherein said first and second substantially known flow rates are substantially equal to 30 liters per minute.

19. A system associated with a load port as recited in claim 15, wherein said first and second substantially known flow rates are substantially equal to between 0.1 to 0.5 liters per minute.

20. A system associated with a load port for receiving a pod, the system providing a controlled flow of gas through an interior of the pod, comprising:

an inlet line having an end affixed within a first opening through a surface of the load port, said inlet line capable of supplying a pressurized gas to the pod;

an outlet line having an end affixed within a second opening through the surface of the load port, said outlet line capable of drawing in gas as a result of a negative pressure within said outlet line;

an inlet seal affixed within said first opening, said inlet seal being capable of transferring gas from said inlet line into the interior of the pod; and an outlet seal affixed within said second opening, said outlet seal being capable of directly communicating said negative pressure within said outlet line to interior of the pod to actively remove gas from the interior of the pod.

* * * * *